(12) United States Patent
Duncan

(10) Patent No.: US 10,686,406 B2
(45) Date of Patent: Jun. 16, 2020

(54) METHOD AND APPARATUS FOR MIXING SIGNALS

(71) Applicant: u-blox AG, Thalwil (CH)

(72) Inventor: Niall Duncan, Mahon Cork (IE)

(73) Assignee: u-blox AG, Thalwil (CH)

(*) Notice: Subject to any disclaimer, the term of this patent is extended or adjusted under 35 U.S.C. 154(b) by 0 days.

(21) Appl. No.: 15/568,773

(22) PCT Filed: Apr. 24, 2015

(86) PCT No.: PCT/EP2015/058991
§ 371 (c)(1),
(2) Date: Oct. 23, 2017

(87) PCT Pub. No.: WO2016/169626
PCT Pub. Date: Oct. 27, 2016

(65) Prior Publication Data
US 2018/0091098 A1 Mar. 29, 2018

(51) Int. Cl.
*H03D 7/14* (2006.01)
*H03D 7/16* (2006.01)

(52) U.S. Cl.
CPC ......... *H03D 7/1458* (2013.01); *H03D 7/1441* (2013.01); *H03D 7/1466* (2013.01); *H03D 7/165* (2013.01)

(58) Field of Classification Search
CPC .. H03D 7/1458; H03D 7/1441; H03D 7/1433; H03D 7/165; H03D 7/166; H03D 7/168
(Continued)

(56) References Cited

U.S. PATENT DOCUMENTS 7,106,241 B1 * 9/2006 Felder ................. H03M 3/35
341/122
2005/0164669 A1 7/2005 Molnar et al.
(Continued)

FOREIGN PATENT DOCUMENTS

EP  0613150 B1  3/1999
EP  0929934 B1  3/2004
(Continued)

OTHER PUBLICATIONS

Rhee, Woogeun, "Wireless Transceiver Circuits: System Perspectives and Design Aspects (Devices, Circuits, and Systems)" 1st, CRC Press, 2015, pp. 16-28.
(Continued)

*Primary Examiner* — Patrick C Chen
(74) *Attorney, Agent, or Firm* — Finnegan, Henderson, Farabow, Garrett & Dunner LLP

(57) ABSTRACT

A circuit comprising: a first passive mixer (21) having mixer inputs configured to receive in-phase (I) and quadrature-phase (Q) differential signals; and a first differential sub-circuit (31). The first passive mixer is configured to switch the in-phase (I) and quadrature-phase (Q) differential signals to the first differential sub-circuit at a mixing frequency. The first differential sub-circuit (31) has a pair of differential inputs configured to receive the switched in-phase (I) and quadrature-phase (Q) differential signals from the first passive mixer (21), each input having a capacitance capable of storing a charge that depends on the switched in-phase or quadrature-phase signals. The circuit further comprises a charge canceller configured to supply, to at least one of: the mixer inputs; and the pair of differential inputs, an opposite charge compared with a charge that has been stored on the pair of differential inputs by the operation of the first passive mixer.

13 Claims, 6 Drawing Sheets

(58) Field of Classification Search
USPC .......................................................... 327/361
See application file for complete search history.

(56) References Cited

U.S. PATENT DOCUMENTS

| | | | |
|---|---|---|---|
| 2009/0197552 A1 | 8/2009 | Kurahashi et al. | |
| 2012/0161994 A1 | 6/2012 | Quiquempoix et al. | |
| 2013/0257508 A1 | 10/2013 | Goel et al. | |
| 2014/0004805 A1 | 1/2014 | Bagger | |
| 2014/0171001 A1* | 6/2014 | Fernando | H04B 17/21 455/226.1 |
| 2014/0365841 A1* | 12/2014 | Yen | H04B 17/0085 714/734 |
| 2015/0333718 A1* | 11/2015 | Lemkin | H03G 3/20 455/234.1 |

FOREIGN PATENT DOCUMENTS

| | | |
|---|---|---|
| EP | 1523702 B1 | 12/2010 |
| EP | 2328056 B1 | 9/2014 |

OTHER PUBLICATIONS

Razavi, Behzad, "Design of Analog CMOS Integrated Circuits", 1st Edition, Chapter 12, McGraw-Hill Education, 2000, pp. 395-438.

Liu, Mingliang, "Demystifying Switched Capacitor Circuits: Demystifying Technology", vol. 1, Chapter 3, Newnes, 2006, 10 pages.

Lee et al., "A High Linear Low Flicker Noise 25% Duty Cycle LO I/Q Mixer for a FM Radio Receiver", Department of Electrical Engineering, Korea Advanced Institute of Science and Technology, 2011, pp. 1399-1402.

Kuremyr, Tobias, "A Study on Linearity of Mixers for Homodyne Receivers", KTH Information and Communication Technology, Master of Science Thesis, Stockholm, 2013, 93 pages.

International Search Report and Written Opinion received for PCT Patent Application No. PCT/EP2015/058991, dated Apr. 20, 2016, 17 pages.

International Preliminary Report on Patentability received for PCT Patent Application No. PCT/EP2015/058991, dated Nov. 2, 2017, 13 pages.

* cited by examiner

METHOD AND APPARATUS FOR MIXING SIGNALS

FIELD OF THE INVENTION

This invention relates to a method and apparatus for mixing signals. It relates, in particular, to a method and apparatus for mixing signals using a passive mixer in a transmitter. The invention may be particularly relevant to implementations of a direct-conversion IQ modulator using a 25% duty cycle.

BACKGROUND OF THE INVENTION

A direct-conversion IQ modulator using a 25% duty cycle is known in the art.

One example of a transmitter of this kind consists of a baseband signal generator, baseband filter, passive mixer and a sub-circuit. The sub-circuit may be a further mixer, an amplifier (or driving amplifier DA), or other circuit connected before an antenna. In the following description, an amplifier is assumed for the sub-circuit. The input gates of the amplifier may be high impedance inputs with some parasitic capacitance. Any capacitance will cause charge to be stored on the high impedance amplifier input gate in each time period (or phase) of the operation of the passive mixer, and this charge may be fed back onto the filter output via the mixer's switching mechanism, in the subsequent time period. Due to the order of the mixer periods/phases (I(+), Q(+), I(−), Q(−)) the fed-back charge causes undesired cross-coupling between the I-channel and the Q-channel. In the example of FIG. 1, the cross-coupling occurs at the output of the baseband filter, which has the effect that the frequency response of this filter may be shifted by some finite offset frequency.

With respect to FIG. 1, part of an example known transmitter structure is shown schematically. The transmitter comprises a baseband filter 11. The inputs to the baseband filter may come from a Digital to Analogue Converter (DAC) (not shown). The baseband filter 11 as shown in FIG. 1 comprises an in-phase (I) filter 13 with positive I(+) and negative I(−) differential outputs. Furthermore the baseband filter 11 comprises a quadrature-phase (Q) filter 15 with positive Q(+) and negative Q(−) differential outputs. Herein, "positive" and "negative" inputs and outputs refer to non-inverting and inverting differential inputs and outputs, respectively. As will be apparent to those skilled in the art, the labelling of one terminal in a differential circuit as "positive" and the other terminal as "negative" is essentially arbitrary.

The transmitter further comprises a passive mixer 21. The baseband filter outputs provide the inputs to the passive mixer. The mixer 21 comprises pairs of switches configured to switch or selectively couple the positive and negative I differential inputs I(+) and I(−) and positive and negative Q differential inputs Q(+) and Q(−) to the mixer differential outputs. The mixer operates in such a manner that the output of the mixer for a full mixer cycle can be divided into four time periods or phases. These phases are determined by the local oscillator signals shown in FIG. 2, which control the switches. The first phase occurs as switches 22, 25 (controlled by local oscillator signal LO1) couple the positive and negative differential in-phase inputs I(+) and I(−) to the mixer first and second differential outputs, respectively. The second phase occurs as switches 26, 29 (controlled by local oscillator signal LO2) couple the positive and negative differential quadrature phase inputs Q(+) and Q(−) to the mixer first and second differential outputs, respectively. The third phase occurs as switches 23, 24 (controlled by local oscillator signal LO3) couple the positive and negative differential in-phase inputs I(+) and I(−) to the mixer second and first differential outputs, respectively. The fourth phase occurs as switches 27, 28 (controlled by a local oscillator signal LO4) couple the positive and negative differential quadrature phase inputs Q(+) and Q(−) to the mixer second and first differential outputs respectively. Having completed one cycle of first, second, third and fourth phases, the mixer may then repeat the cycle. The mixer as described herein outputs the switched signals at the mixing (LO) frequency to the sub-circuit 31. In the process, it also combines the in-phase and quadrature-phase differential signals into a single pair of differential outputs, which are coupled to the inputs of the sub-circuit 31.

The transmitter further comprises a sub-circuit 31, for example an amplifier (or driving amplifier DA) configured to receive and combine the mixer 21 differential outputs. The sub-circuit 31 is shown in FIG. 1 as a differential amplifier with the gates of the amplifier's input transistors 35 and 37 coupled to the mixer and configured to receive the mixer 21 outputs. The remainder of the amplifier circuit (including the antenna load) is indicated schematically by block 36, coupled to the transistors 35 and 37. The parasitic capacitances CIN(+) and CIN(−) are indicated in FIG. 1 by the capacitors 33 and 39, coupling the gates of transistors 35 and 37, respectively, to ground.

The input capacitance of the sub-circuit 31 is charged during each LO phase and this charge is fed back to the mixer input via the switching mechanism of the mixer. This can be demonstrated, for example, by the capacitors 33, 39 at the end of the positive in-phase I(+) part being charged to voltages VI(+) and VI(−) respectively. As the mixer switches between the first period and the second period, the charge associated with voltages VI(+) and VI(−) from the first period is then fed back to the mixer quadrature-phase inputs Q(+) and Q(−).

This feedback of charge, between periods or phases of the mixer cycle, may cause asymmetry in the operation of the transmitter. Not only is there crosstalk between the I-channel and Q-channel, but the feedback charge polarity is different in different phases—the charge being "added" after some of the transitions (namely, at the start of phases LO2 and LO4), but being "subtracted" after the other transitions (namely, at the start of phases LO1 and LO3).

It is known to minimise this effect by increasing the amplifier input capacitance relative to the mixer input capacitance, but increasing the capacitance does not solve the problem and furthermore is problematic in that it slows down the operation of the amplifier and therefore degrades the performance of the transmitter.

SUMMARY OF THE INVENTION

The invention is defined by the claims.

According to an aspect of the present invention, there is provided a circuit comprising:

a first passive mixer having mixer inputs configured to receive in-phase and quadrature-phase differential signals; and a first differential sub-circuit, wherein the first passive mixer is configured to switch the in-phase and quadrature-phase differential signals to the first differential sub-circuit at a mixing frequency; and the first differential sub-circuit has a pair of differential inputs configured to receive the switched in-phase and quadrature-phase differential signals from the first passive mixer, each input having a capacitance capable of storing a charge that depends on the switched in-phase or quadrature-phase signals, the circuit further comprising a charge canceller configured to supply, to at least one of: the mixer inputs; and the pair of differential inputs, an opposite charge compared with a charge that has been stored on the pair of differential inputs by the operation of the first passive mixer.

The circuit may be comprised in a transmitter and the in-phase and quadrature-phase differential signals may be supplied from an analogue circuit element such as a filter, optionally a baseband filter. Alternatively, in some embodiments, the differential signals may be supplied directly from a Digital to Analogue Converter (DAC), with baseband processing performed in the digital domain. The transmitter may be implemented within at least one of: a cellular base station; a wireless-network access point; and user equipment, including but not limited to a mobile phone (cellular phone).

The charge canceller may be configured to supply an opposite charge after a switching event, said opposite charge being opposite to the charge stored on the pair of differential inputs before the switching event. The charge canceller may be configured to compensate for or mitigate the feedback charge generated before a switching event being fed back into the baseband signal filter following a switching event and therefore reduce or remove the asymmetry between the I and Q channels, described above.

A capacitance at predetermined nodes in the charge canceller may be substantially equal to the capacitance of the pair of differential inputs of the first differential sub-circuit. The charge canceller may comprise at least one transistor or capacitor, and preferably comprises a pair of transistors or capacitors, each configured to store a charge substantially equal to a charge stored on one of the differential inputs. In the case of a transistor, the charge may be stored on the gate of the transistor, wherein the gate of the transistor acts like a capacitor. The transistor may be a Metal-Oxide-Semiconductor (MOS) transistor.

When signals are "switched to", "coupled to", or "supplied to" a specified node or circuit element, they may be either directly or indirectly coupled to that node or circuit element. Indirect coupling means that signals may be coupled to a specified node or circuit element via one or more other circuit elements.

A charge is stored on each differential input of the first differential sub-circuit before a switching event. The charge stored on the positive (non-inverting) input is generally equal in magnitude and opposite in polarity to the charge stored on the negative (inverting) input. After the switching event, this charge could be fed back to one of the mixer inputs, via the first passive mixer. The charge canceller is configured to supply, after the switching event, a charge that is substantially equal in magnitude and opposite in polarity to the charge that was stored before the switching event. This may also be referred to herein as an "opposite charge".

The inputs of the first differential sub-circuit are typically high impedance inputs. "High impedance" typically means that the inputs present an impedance of greater than 100 KΩ, preferably greater than 500 KΩ, more preferably greater than 1 MΩ, still more preferably greater than 10 MΩ. In general, the capacitance at the inputs may comprise a parasitic capacitance, and/or may comprise a physical capacitor.

The mixer typically comprises a plurality of switches.

A switching event may comprise opening (switching off) or closing (switching on) at least one of the plurality of switches and preferably comprises opening at least one switch and closing at least one other switch. In particular, before a switching event, one input of the first differential sub-circuit may be coupled, via one of the switches, to one input of the first passive mixer. After the switching event, this input of the first differential sub-circuit will be coupled, via another of the switches, to another input of the first passive mixer.

In some embodiments, a switch may be formed by one or more transistors or may use a CMOS switch with inverted switching waveforms.

The charge canceller may comprise a second passive mixer and a second differential sub-circuit in parallel with the first passive mixer and first differential sub-circuit.

In particular, the output of the first passive mixer may be coupled, preferably directly coupled, to the input of the first differential sub-circuit. The input of the first passive mixer may be coupled, preferably directly, to the input of the second passive mixer. The output of the second passive mixer may be coupled, preferably directly, to the input of the second differential sub-circuit.

The first passive mixer is preferably configured to switch the differential signals to the first differential sub-circuit in a plurality of non-overlapping time periods, wherein the second differential sub-circuit has a pair of differential inputs, and wherein the second passive mixer is configured to switch, to the mixer inputs, in each time period, an opposite charge to a charge stored on the differential inputs of the first differential sub-circuit in the preceding time period, said opposite charge having been stored on the differential inputs of the second sub-circuit in said preceding time period.

In each time period, the inputs of the first differential sub-circuit may be coupled, via switches, to different ones of the inputs of the mixer. The time periods may be separated by switching events. That is, a switching event occurs between each time period and the next time period.

Optionally, the pair of differential inputs of the first sub-circuit comprises a positive input and a negative input and the first passive mixer comprises: a first pair of switches configured to couple positive and negative differential in-phase signals to the positive and negative inputs of the first sub-circuit respectively; a second pair of switches configured to couple the positive and negative differential in-phase signals to the negative and positive inputs of the first sub-circuit respectively; a third pair of switches configured to couple positive and negative differential quadrature-phase signals to the positive and negative inputs of the first sub-circuit respectively; and a fourth pair of switches configured to couple the positive and negative differential quadrature-phase signals to the negative and positive inputs of the first sub-circuit respectively, and wherein the pair of differential inputs of the second sub-circuit comprises a positive input and a negative input and wherein the second passive mixer comprises: a first pair of switches configured to couple the positive and negative differential in-phase signals to the positive and negative inputs of the second sub-circuit respectively; a second pair of switches configured to couple the positive and negative differential in-phase signals to the negative and positive inputs of the second sub-circuit respectively; a third pair of switches configured to couple the positive and negative differential quadrature-phase signals to the positive and negative inputs of the second sub-circuit respectively; and a fourth pair of switches configured to couple the positive and negative differential quadrature-phase signals to the negative and positive inputs of the second sub-circuit respectively, wherein the first passive mixer first pair of switches and the second passive mixer first pair of switches are configured to be operated in synchrony, the first passive mixer second pair of switches and the second passive mixer second pair of switches are configured to be operated in synchrony, the first passive mixer third pair of switches and the second passive mixer fourth pair of switches are configured to be operated in synchrony, and the first passive mixer fourth pair of switches and the second passive mixer third pair of switches are configured to be operated in synchrony.

Two or more switches can be configured to operate in synchrony with one another by controlling them with the same control signal or by generating a duplicate or inverted version of the control signal, for example using a buffer or an inverter. The control signal may be a clock signal. The first passive mixer first pair of switches and the second passive mixer first pair of switches may therefore be controlled by a first clock signal (or by duplicated or inverted versions of the first clock signal); the first passive mixer second pair of switches and the second passive mixer second pair of switches may be controlled by a second clock signal (or by duplicated or inverted versions of the second clock signal); the first passive mixer third pair of switches and the second passive mixer fourth pair of switches may be controlled by a third clock signal (or by duplicated or inverted versions of the third clock signal); and the first passive mixer fourth pair of switches and the second passive mixer third pair of switches may be controlled by a fourth clock signal (or by duplicated or inverted versions of the fourth clock signal).

Each of the clock signals is preferably low when any other clock signal is high. Preferably, there is also a guard interval between the falling edge of one clock signal and the rising edge of the next clock signal. This may be the case for an implementation using NMOS transistors, for example. In an implementation using PMOS transistors, each clock signal may be high when any other clock signal is low. And preferably there is a guard interval between the rising edge of each clock signal and the falling edge of the next clock signal.

The charge canceller optionally comprises a second differential sub-circuit, the second differential sub-circuit being configured to be coupled to the output of the first passive mixer in a first configuration when the first passive mixer is configured to switch the in-phase differential signal to the first sub-circuit and the second differential sub-circuit being further configured to be coupled to the output of the passive mixer in a reversed polarity configuration when the first passive mixer is configured to switch the quadrature-phase signal to the first sub-circuit.

A reversed polarity configuration means that the differential signals are provided in a cross-coupled configuration, compared with the first configuration—that is, the positive and negative differential signals are swapped.

The first passive mixer may be configured to switch the differential signals to the first differential sub-circuit in a plurality of non-overlapping time periods, wherein the second differential sub-circuit has a pair of differential inputs, and wherein the circuit is configured to switch, to the differential inputs of the first differential sub-circuit, in each time period, an opposite charge to a charge stored on those inputs in the preceding time period, said opposite charge having been stored on the differential inputs of the second sub-circuit in said preceding time period.

In each time period, the inputs of the first differential sub-circuit may be coupled to different ones of the I and Q channel inputs of the mixer. The time periods may be separated by switching events. That is, a switching event occurs between each time period and the next time period.

Optionally, the pair of differential inputs of the first sub-circuit comprises a positive input and a negative input, the second sub-circuit comprises a pair of differential inputs comprising a positive input and a negative input, and the first passive mixer comprises: first pair of switches configured to couple positive and negative differential in-phase signals to positive and negative inputs of the first sub-circuit respectively; a second pair of switches configured to couple the positive and negative differential in-phase signals to the negative and positive inputs of the first sub-circuit respectively; a third pair of switches configured to couple positive and negative differential quadrature-phase signals to the positive and negative inputs of the first sub-circuit respectively; and a fourth pair of switches configured to couple the positive and negative differential quadrature-phase signals to the negative and positive inputs of the first sub-circuit respectively, and wherein the circuit comprises: a first pair of switches for the second sub-circuit configured to couple the positive and negative inputs of the first sub-circuit to the positive and negative inputs of the second sub-circuit respectively; and a second pair of switches for the second sub-circuit configured to couple the positive and negative inputs of the first sub-circuit to the negative and positive inputs for the second sub-circuit respectively, wherein, optionally, the first pair of switches is configured to be on when the first passive mixer first pair of switches or second pair of switches is on and the second pair of switches is configured to be on when the first passive mixer third pair of switches or fourth pair of switches is on.

The switching may be carried out in a plurality of non-overlapping time periods, as follows. In a first time period, the positive and negative in-phase signals are coupled to the positive and negative inputs, respectively, of the first differential sub-circuit. In a second time period, the positive and negative quadrature-phase signals are coupled to the positive and negative inputs, respectively, of the first differential sub-circuit. In a third time period, the positive and negative in-phase signals are coupled to the negative and positive inputs, respectively, of the first differential sub-circuit. In a fourth time period, the positive and negative quadrature-phase signals are coupled to the negative and positive inputs, respectively, of the first differential sub-circuit.

Assuming this to be the case, the first pair of switches for the second sub-circuit is configured to be active in the first and third periods (that is, the "odd" numbered periods). The second pair of switches for the second sub-circuit is configured to be active in the second and fourth periods (that is, the "even" numbered periods).

Each pair of switches may be controlled by a clock signal.

The second differential sub-circuit preferably has a pair of differential inputs having a capacitance substantially equal to the capacitance of the differential inputs of the first differential sub-circuit.

The pair of differential inputs of the second differential sub-circuit are preferably capable of storing a charge whose value depends on the switched in-phase or quadrature-phase differential signals.

The second differential sub-circuit may be substantially identical to the first differential sub-circuit.

The second differential sub-circuit preferably has the same circuit topology and/or arrangement as the first differential sub-circuit and is preferably provided in the same semiconductor chip as the first differential sub-circuit.

The or each differential sub-circuit may comprise or consist of one or more of: a differential amplifier; a mixer; and a filter.

In particular, the first differential sub-circuit may be a first differential amplifier and the second differential sub-circuit may be a second differential amplifier. The first differential amplifier may be coupled to an antenna load. The second differential amplifier may be coupled to a dummy load. The dummy load preferably presents an impedance that is substantially identical to the impedance presented by the antenna load.

The circuit optionally further comprises a filter configured to supply the in-phase and quadrature-phase differential signals to the first passive mixer.

The filter may be a baseband filter.

Also provided is a method for modulating a signal comprising:

providing in-phase and quadrature-phase differential signals;
switching with a first passive mixer the in-phase and quadrature-phase signals to a first differential sub-circuit at a mixing frequency;
before a switching event, storing at an input of the first differential sub-circuit a charge whose value depends on the switched in-phase or quadrature-phase differential signals; and
after the switching event, supplying, to at least one of: an input of the first passive mixer; and the input of the first differential sub-circuit, a further charge, the further charge being opposite to the charge stored on the input of the first differential sub-circuit before the switching event.

Providing in-phase and quadrature-phase signals may comprise baseband filtering in-phase and quadrature-phase signals.

The first differential sub-circuit may comprise a first differential amplifier and the method may further comprise amplifying the switched in-phase and quadrature-phase differential signals. The first differential amplifier may also combine the I and Q channels into a single channel.

The method optionally comprises switching the in-phase and quadrature phase differential signals to the first differential sub-circuit in a plurality of non-overlapping time periods, successive time-periods being separated by switching events, wherein the step of supplying a further charge after the switching event comprises: switching with a second passive mixer the in-phase and quadrature-phase differential signals to a second differential sub-circuit at the mixing frequency, the method further comprising switching with the second passive mixer, to the input of the first passive mixer, in each time period, an opposite charge to a charge stored on the input of the first differential sub-circuit in the preceding time period, said opposite charge having been stored on an input of the second differential sub-circuit in said preceding time period.

Optionally, the step of switching with the first passive mixer comprises: selectively coupling positive and negative differential in-phase signals to positive and negative inputs of the first sub-circuit respectively during a first time period; selectively coupling the positive and negative differential in-phase signals to the negative and positive inputs of the first sub-circuit respectively during a third time period; selectively coupling positive and negative differential quadrature-phase signals to the positive and negative inputs of the first sub-circuit respectively during a second time period between the first and third time periods; selectively coupling the positive and negative differential quadrature-phase signals to the negative and positive inputs of the first sub-circuit respectively during a fourth time period following the third time period, and wherein switching with the second passive mixer comprises: selectively coupling the positive and negative differential in-phase signals to positive and negative inputs of the second sub-circuit respectively during the first time period; selectively coupling the positive and negative differential in-phase signals to the negative and positive inputs of the second sub-circuit respectively during the third time period; selectively coupling the positive and negative differential quadrature-phase signals to the positive and negative inputs of the second sub-circuit respectively during the fourth time period; selectively coupling the positive and negative differential quadrature-phase signals to the negative and positive inputs of the second sub-circuit respectively during the second time period.

Optionally, switching with the first passive mixer comprises: selectively coupling positive and negative differential in-phase signals to positive and negative inputs of the first differential sub-circuit respectively during a first time period; selectively coupling the positive and negative differential in-phase signals to the negative and positive inputs of the first differential sub-circuit respectively during a third time period; selectively coupling positive and negative differential quadrature-phase signals to the positive and negative inputs of the first differential sub-circuit respectively during a second time period between the first and third time periods; selectively coupling the positive and negative differential quadrature-phase signals to the negative and positive inputs of the first differential sub-circuit respectively during a fourth time period following the third time period, and wherein the method further comprises: selectively coupling the positive and negative differential in-phase signals to the: positive and negative inputs of a second differential sub-circuit respectively during the first time period; negative and positive inputs of the second differential sub-circuit respectively, during the third time period, selectively coupling the positive and negative differential quadrature-phase signals to the: positive and negative inputs of the second differential sub-circuit respectively during the fourth time period; negative and positive inputs of the second differential sub-circuit respectively, during the second time period, and the method further comprises: selectively coupling the positive and negative inputs of the first differential sub-circuit to the positive and negative inputs of the second differential sub-circuit respectively during the first and third time periods; and selectively coupling the positive and negative inputs of the first differential sub-circuit to the negative and positive inputs of the second differential sub-circuit respectively during the second and fourth time periods.

BRIEF DESCRIPTION OF THE DRAWINGS

The invention will now be described by way of example with reference to the accompanying drawings, in which:

FIG. 3b shows a resistor that is equivalent to the switched-capacitor circuit of FIG. 3a;

Figure 1:
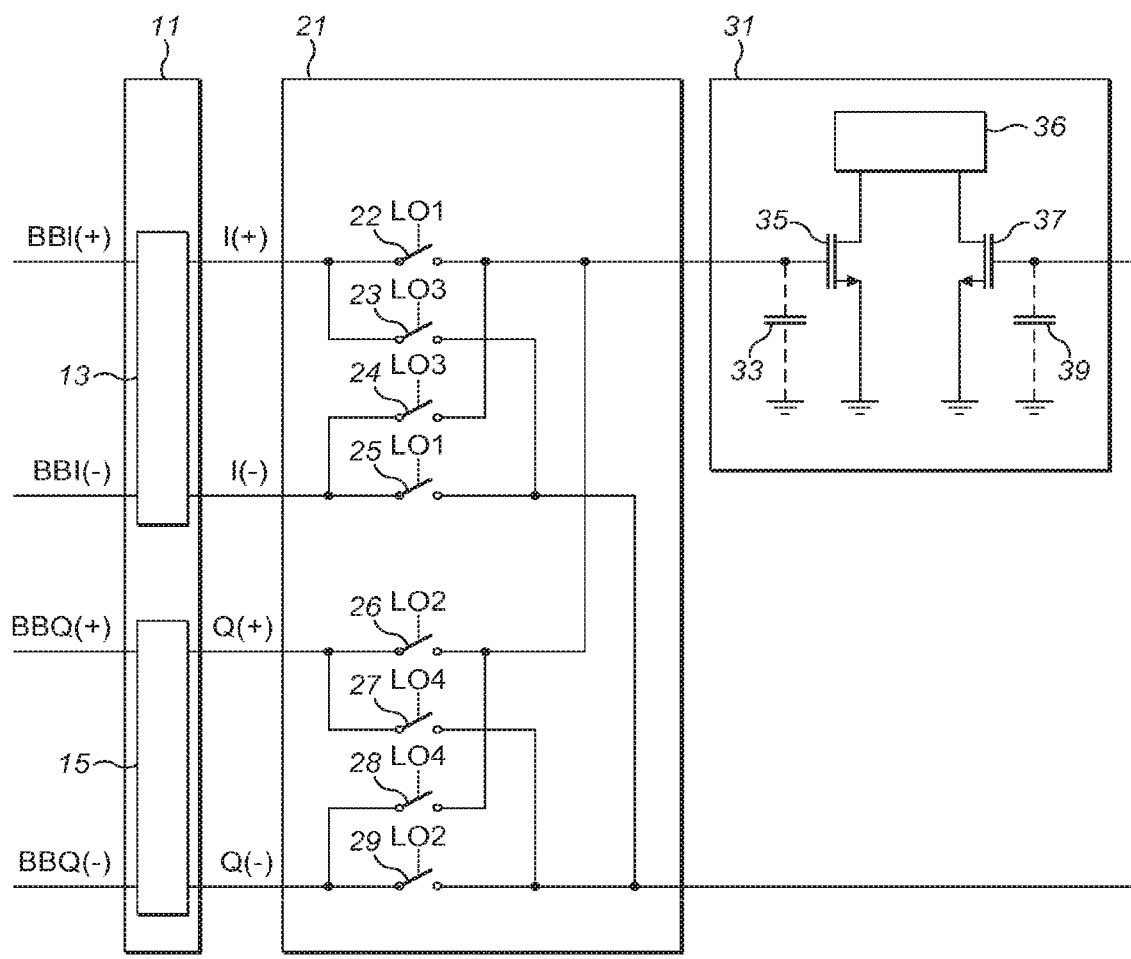
FIG. 1 illustrates part of a transmitter known in the art.

It should be noted that these figures are diagrammatic and not drawn to scale. Relative dimensions and proportions of parts of these figures have been shown exaggerated or reduced in size, for the sake of clarity and convenience in the drawings. In some of the diagrams, some elements may have been omitted or simplified for the purposes of clarity and conciseness.

DETAILED DESCRIPTION

According to one embodiment there is provided a circuit including a passive mixer capable of receiving in-phase (I) and quadrature-phase (Q) differential signals. The passive mixer is configured to receive the differential in-phase and quadrature-phase signals and switch them to a first differential sub-circuit at a mixing frequency. In the following example, the first differential sub-circuit is a differential amplifier.

The differential amplifier is configured to receive the switched differential in-phase and quadrature-phase signals at a pair of differential inputs. A capacitance at each input of the amplifier stores a charge which is proportional to the switched in-phase and quadrature-phase signals. This capacitance may comprise a parasitic capacitance, or a capacitor deliberately included in the circuit (or a combination of both).

Additionally, the circuit comprises a charge canceller. The charge canceller is configured to supply, to either the mixer inputs or the pair of differential (amplifier) inputs (or both), an opposite charge compared with a charge that has been stored on the pair of differential inputs by the operation of the first passive mixer (at a previous point in time). In greater detail, the charge canceller circuit is configured to supply a compensating charge after each switching event. The compensating charge is intended to compensate for the charge stored on the amplifier inputs before the switching event. In such a manner the charge canceller can be configured to mitigate or substantially cancel the charge generated before the switching event and therefore can reduce or remove the contamination or crosstalk between the I and Q channels. In particular, the charge canceller may be configured to provide a charge of the same or substantially the same magnitude but with the opposite (negative or inverted) polarity to the charge that was stored on the amplifier inputs prior to the switching event.

To better explain the advantages of the embodiments described herein, an analysis of the partial transmitter circuit shown in FIG. 1 will be provided.

Figure 3A:
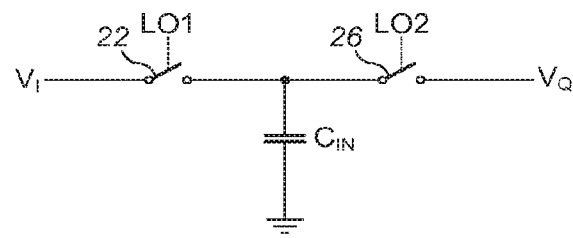
FIG. 3a shows a switched-capacitor circuit, which will be used to analyse the operation of the circuit of FIG. 1.

The capacitance at the input of the sub-circuit 31 together with the switches of the passive mixer 21 forms the switched-capacitor circuit shown in FIG. 3a. Note that a single-ended circuit has been assumed since both halves of the differential circuit shown in FIG. 1 behave in an identical manner hence the connections to I(−) and Q(−) as well as the corresponding switches can be ignored.

Figure 2:
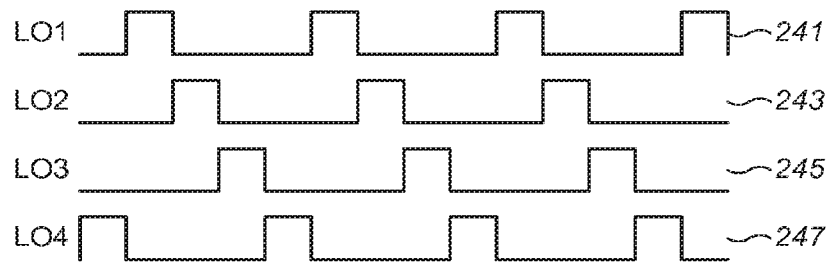
FIG. 2 shows the 25% duty-cycle clock (local oscillator) signals for controlling the switches of the passive mixer in the transmitter of FIG. 1.

The switched-capacitor circuit depicted in FIG. 3a consists of a capacitance $C_{IN}$ with one plate shunted to ground connected between switch 22 and switch 26 which are in turn connected to the passive mixer input voltages $V_I$ and $V_Q$, respectively. The switches 22 and 26 are controlled by the clock signals LO1 and LO2, respectively. The waveforms for the clock signals LO1 and LO2 are non-overlapping, as already illustrated in FIG. 2. It is assumed that the voltages $V_I$ and $V_Q$ are changing very slowly relative to the clock signals LO1 and LO2. Furthermore, in the following analysis, switches 22 and 26 are assumed ideal with zero on-resistance and infinite off-resistance.

Figure 3B:

It can be shown that the average current flowing from the left hand side to the right hand side of the circuit shown in FIG. 3a over one clock period is given by:

$$i_{average} = \frac{C_{IN}(V_I - V_Q)}{T}$$

Where T denotes the clock period of LO1 and LO2 (both LO1 and LO2 have the same period). Thus the switched-capacitor circuit of FIG. 3a behaves like the continuous-time resistor shown in FIG. 3b, where the value of the equivalent (discrete-time) resistor $R_{eq}$ is given by $$R_{eq} = \frac{1}{C_{IN}F_{LO}}$$

Here $F_{LO}$ is the switching frequency of the clock signals LO1 and LO2, i.e. 1/T.

Secondly, it is assumed that the baseband filter 11 of FIG. 1 behaves as a passive first order (single-pole) filter for each of the I-channel and the Q-channel. Since it is passive, it is assumed that the first order filter for each channel can be modelled as an RC circuit. The input to the RC filter is a baseband voltage VBB. This is coupled through a series resistor $R_p$ to the filter output node. The filter output node is coupled via a capacitor $C_p$ to ground. The filter output node is coupled to one of the inputs to the mixer 21 in FIG. 1. The input voltages to the mixer, at the respective filter output nodes, are denoted by VI and VQ, for the I- and Q-phases, respectively.

By considering the switching event when the passive mixer switches from the fourth phase (controlled by LO4) to the first phase (controlled by LO1), the following transfer function can be derived:

$$VI(+) = \frac{G\omega_{3dB}}{s + \omega_{3dB}}(VBBI(+) - kVQ(+)) \quad (3)$$

Where:

$$G = \frac{R_{eq}}{R_p + R_{eq}} \quad (4)$$

$$\omega_{3dB} = \frac{1}{\frac{R_p R_{eq}}{R_p + R_{eq}} C_p} \quad (5)$$

$$k = \frac{R_p}{R_{eq}} \quad (6)$$

The −VQ(+) term reflects the fact that, during the fourth phase, the inverting quadrature-phase input of the mixer (and output of the baseband filter), Q(−) was coupled to the gate of transistor 35 of sub-circuit 31. At the start of the next phase (the first phase), this voltage is coupled to the non-inverting in-phase input I(+) of the mixer. It is assumed that the inverting and non-inverting voltages are equal and opposite to one another. That is, VI(+)=−VI(−) and VQ(+)=−VQ(−).

In a similar way, by considering the switching event when the mixer switches from the first phase (controlled by LO1) to the second phase (controlled by LO2) another transfer function can be derived:

$$VQ(+) = \frac{G\omega_{3dB}}{s + \omega_{3dB}} (VBBQ(+) + kVI(+)) \quad (7)$$

Where:

$$G = \frac{R_{eq}}{R_p + R_{eq}} \quad (8)$$

$$\omega_{3dB} = \frac{1}{\frac{R_p R_{eq}}{R_p + R_{eq}} C_p} \quad (9)$$

$$k = \frac{R_p}{R_{eq}} \quad (10)$$

Analysis of the system for the LO3 and LO4 phases produces similar equations.

These equations show, as expected, that the signals in one phase are not independent of the signals in the other phases of operation of the circuit. In particular, there is crosstalk between the I- and Q-channels. Consequently, the baseband filter does not perform as expected following a switching event.

The effect of the crosstalk is a frequency shift (or translation) of the transfer function of the baseband filter 11. On the assumptions described previously above, the frequency shift can be shown to be:

$$\omega_{shift} = \frac{R_p \frac{R_p C_d F_{LO} + 1}{R_p C_p}}{\frac{1}{C_d F_{LO}}} = \frac{R_p C_d^2 F_{LO}^2 + C_d F_{LO}}{C_p} \quad (11)$$

In theory, this problem could be mitigated by introducing buffering between the baseband filter outputs and the passive mixer inputs. Unfortunately, this is not a practical solution. The buffer would need to have very high gain at high frequency in order to eliminate the crosstalk using this approach. Furthermore, four separate buffers would be required one for each mixer input and these buffers would need to sufficiently match one another.

Figure 4:
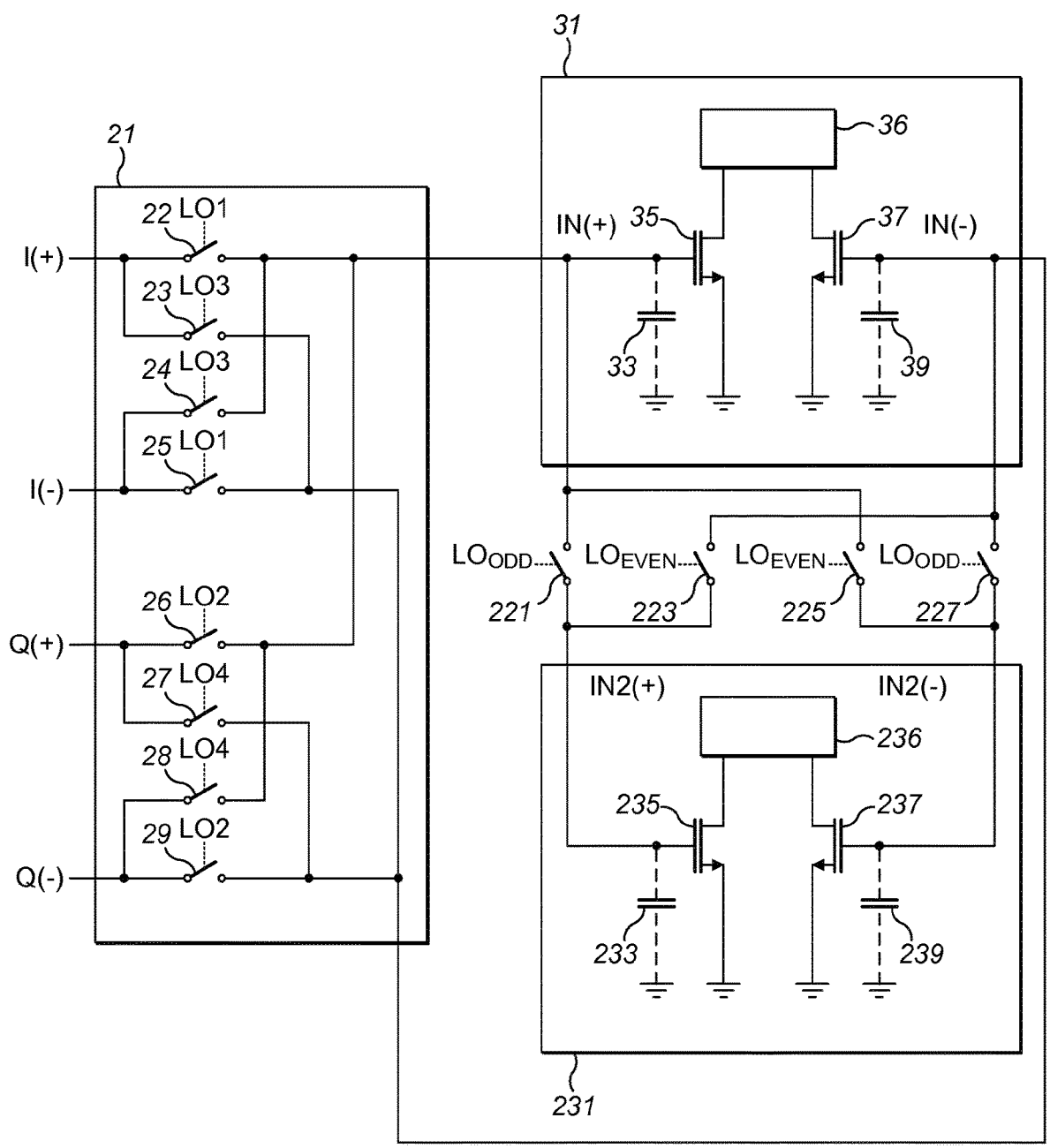
FIG. 4 illustrates part of a transmitter according to one embodiment of the invention.

FIG. 4 shows an example circuit comprising a charge canceller according to an embodiment (of the invention). In this embodiment, the example circuit is part of a transmitter. FIG. 4 shows a passive mixer 21, and sub-circuit 31 configured in a similar arrangement to the circuit shown in FIG. 1. The passive mixer of FIG. 4 can be identical to the passive mixer of FIG. 1 and the sub-circuit of FIG. 4 can be identical to the sub-circuit of FIG. 1. In the embodiment of FIG. 4, like in FIG. 1, the sub-circuit 31 is an amplifier. Accordingly, the same reference numerals will be used. The baseband filter 11 is also present in this embodiment, although this is not shown in FIG. 4, for simplicity.

The circuit in FIG. 4 further comprises a charge canceller 221, 223, 225, 227, 231 configured to store a charge and supply a charge to the mixer 21 or the sub-circuit 31 after a switching event. The charge supplied is opposite to the charge stored on the sub-circuit 31 before the switching event. In the example shown in FIG. 4, the charge canceller comprises a second sub-circuit 231 which is similar to the sub-circuit 31. In particular, the second sub-circuit is designed so that the input capacitance of the second sub-circuit 231 matches, as far as possible, the input capacitance of the sub-circuit 31. In the present embodiment, this can be achieved by providing a second sub-circuit 231 that has the same circuit configuration and arrangement as the sub-circuit 31. Consequently, the second sub-circuit 231 has input parasitic capacitances CIN2(+) and CIN2(−), like the sub-circuit 31. These parasitic capacitances are represented in FIG. 4 by capacitors 233 and 239, respectively. The second sub-circuit 231 inputs are configured to be coupled to the sub-circuit 31 inputs via a switching network. Or, in other words, the second sub-circuit 231 is configured to be coupled to the output of the passive mixer 21 by the switching network.

In this example, the second sub-circuit 231 is a second amplifier. The second amplifier has inputs that are coupled to the gates of respective transistors 235 and 237. The drains of transistors 235 and 237 are coupled to the remainder of the amplifier, represented schematically by block 236. The block 236 preferably matches, as far as possible, the block 36 in the sub-circuit 31, which is an amplifier in this embodiment. However, instead of an antenna load, the block 236 includes a component that provides an equivalent load to the antenna load of block 36. For example, the component may present the same impedance as the antenna load of block 36. It is desirable that the sub-circuits 31 and 231 match one another both physically and functionally.

The switching network as shown in the embodiment of FIG. 4 comprises a pair of switches 221 and 227 which are controlled by a first switching mixer or LO signal $LO_{ODD}$ and are configured to couple the positive and negative inputs, IN2(+) and IN2(−) respectively, of the second sub-circuit 231 to the positive and negative outputs of the passive mixer 21 (or the positive and negative inputs, IN(+) and IN(−), of the sub-circuit 31) respectively. This can be seen as a straight coupling between sub-circuit and second sub-circuit inputs where the 'positive' inputs are connected or coupled together and the 'negative' inputs are connected or coupled together. Furthermore the switching network further comprises a second pair of switches 223 and 225 (for the second sub-circuit 231) which are controlled by a second switching mixer or LO signal $LO_{EVEN}$ and are configured to couple the positive and negative inputs IN2(+) and IN2(−) of the second sub-circuit 231 to the negative and positive outputs of the passive mixer 21 (or the negative and positive inputs IN(−) and IN(+) of the sub-circuit 31) respectively. This can be seen as cross coupling the sub-circuit and second sub-circuit inputs where the 'positive' sub-circuit input is connected or coupled to the 'negative' second sub-circuit input and the 'negative' sub-circuit input is connected or coupled to the 'positive' second sub-circuit input.

Figure 5:
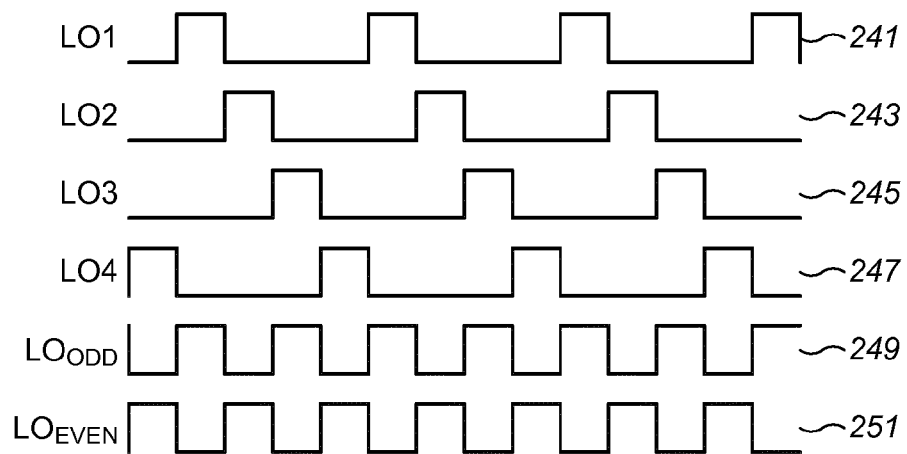
FIG. 5 shows the 25% duty-cycle clock (local oscillator) signals for controlling the switches of the passive mixer and other switches in the embodiment of FIG. 4.

The control signals for the switching network in the passive mixer are shown in FIG. 5. In the passive mixer 21, a first pair of switches 22 and 25, controlled by a local oscillator (LO) signal LO1 241, are configured to couple positive and negative differential baseband in-phase signals, I(+) and I(−), to positive and negative inputs, IN(+) and IN(−) respectively, of the sub-circuit 31. The mixer second pair of switches, 23 and 24, controlled by a LO signal LO3 245, are configured to couple the positive and negative differential baseband in-phase signals, I(+) and I(−) to the negative and positive inputs IN(−) and IN(+), respectively, of the sub-circuit 31. The mixer third pair of switches, 26 and 29, controlled by a LO signal LO2 243, are configured to couple positive and negative differential baseband quadrature-phase signals Q(+) and Q(−) to the positive and negative inputs IN(+) and IN(−), respectively, of the sub-circuit. Signal LO2 switches on the third pair of switches 26 and 29 between the "on" periods of LO1 and LO3. Hence, the second phase occurs between the first and third phases. The mixer fourth pair of switches, 27 and 28, controlled by a LO signal LO4 247, are configured to couple the positive and negative differential baseband quadrature-phase signals Q(+) and Q(−) to the negative and positive inputs IN(−) and IN(+) respectively of the sub-circuit 31. Signal LO4 switches on the fourth pair of switches after the "on" period of LO3 and before the "on" period of the next cycle of LO1. Hence, the fourth phase occurs between the third phase and the first phase.

The LO signal $LO_{ODD}$ 249 for the first pair of switches for the second sub-circuit 231 is configured to be active when the passive mixer first pair of switches or second pair of switches are active (in other words when the passive mixer is coupling or switching an in-phase related signal). The control signal $LO_{EVEN}$ 251 for the second pair of switches for the second sub-circuit 231 is configured to be active when the passive mixer third pair of switches or fourth pair of switches are active (in other words when the passive mixer is coupling or switching a quadrature-phase related signal).

This produces the effective charge-cancelling operation by, as discussed herein, using the polarity asymmetry of the charge feedback for the "I" (I(+), I(−)) related phases (LO1 and LO3) and the "Q" (Q(+), Q(−)) related phases (LO2 and LO4).

The charge-cancelling effect can be modelled and analysed in a similar fashion to that discussed previously above for the circuit of FIG. 1. Treating the baseband filter 11 as a passive 1st order filter for each phase and substituting equivalent resistors for the switched capacitor networks, a transfer function can be derived that models the behaviour of the circuit at the start of the second phase (the Q(+) phase), after the end of the first phase (the I(+) phase). Using the assumption that the parasitic capacitance CIN(+) indicated by capacitor 33 is equal to the parasitic capacitance CIN2(−) of the capacitor 239, the equivalent resistors $R_{eq}$ can be defined as:

$$R_{eq} = \frac{1}{CIN(+)F_{LO}} \equiv \frac{1}{CIN2(-)F_{LO}} \quad (12)$$

The transfer function for this system can be derived using Kirchhoff's Current Law (KCL) at the input node Q(+) of the mixer (the output node Q(+) of the baseband filter). The transfer function can be shown to reduce to:

$$sC_p VQ(+) + (VQ(+) - VBBQ(+))\frac{1}{R_p} + \frac{VQ(+)}{R_{eq}} + \frac{VQ(+)}{R_{eq}} = 0 \quad (13)$$

This demonstrates that VQ(+) is independent of VI(+), and therefore the crosstalk has been removed. A similar analysis shows that VI(+) is independent of VQ(+).

Furthermore, it is possible to analyse the circuit to produce the resulting transfer function of the baseband filter (written here for the Q-channel) as:

$$VQ(+) = \frac{\frac{R_{eq}}{2R_p + R_{eq}}\left(\frac{2R_p + R_{eq}}{R_p R_{eq} C_p}\right)}{s + \frac{2R_p + R_{eq}}{R_p R_{eq} C_p}} VBBQ(+) \leftrightarrow \frac{G\omega_{3dB}}{s + \omega_{3dB}} \quad (14)$$

Similarly, the baseband gain, G, of the baseband filter can be derived as:

$$G = \frac{R_{eq}}{2R_p + R_{eq}} \quad (15)$$

In contrast, as derived previously above, the gain for a passive 1st order RC filter without charge-cancellation was:

$$G_{No\_Cancellation} = \frac{R_{eq}}{R_p + R_{eq}} \quad (16)$$

Therefore, the resulting loss in signal due to the cancellation scheme is:

$$LOSS_{Due\_To\_Cancellation} = \frac{G}{G_{No\_Cancellation}} = \frac{R_p + R_{eq}}{2R_p + R_{eq}} \quad (17)$$

Where reasonable values of $R_p$ and $R_{eq}$ are 100 and 200 Ohms respectively, this results in a loss of 2.5 dB due to charge-cancellation. In the worst case, when $R_{eq}$ approaches zero, the loss due to cancellation approaches −6 dB.

The bandwidth, $\omega_{3dB}$, of the baseband filter is:

$$\omega_{3dB} = \frac{2R_p + R_{eq}}{R_p R_{eq} C_p} \quad (18)$$

In contrast, the bandwidth without charge cancellation was derived previously above to be:

$$\omega_{3dB,No\_Cancellation} = \frac{R_p + R_{eq}}{R_p R_{eq} C_p} \quad (19)$$

The resulting increase in filter bandwidth according to the present embodiment can therefore be written as:

$$\omega_{Increase\_Due\_To\_Cancellation} = \frac{\omega_{3dB}}{\omega_{3dB,No\_Cancellation}} = \frac{2R_p + R_{eq}}{R_p + R_{eq}} \quad (20)$$

Figure 6:
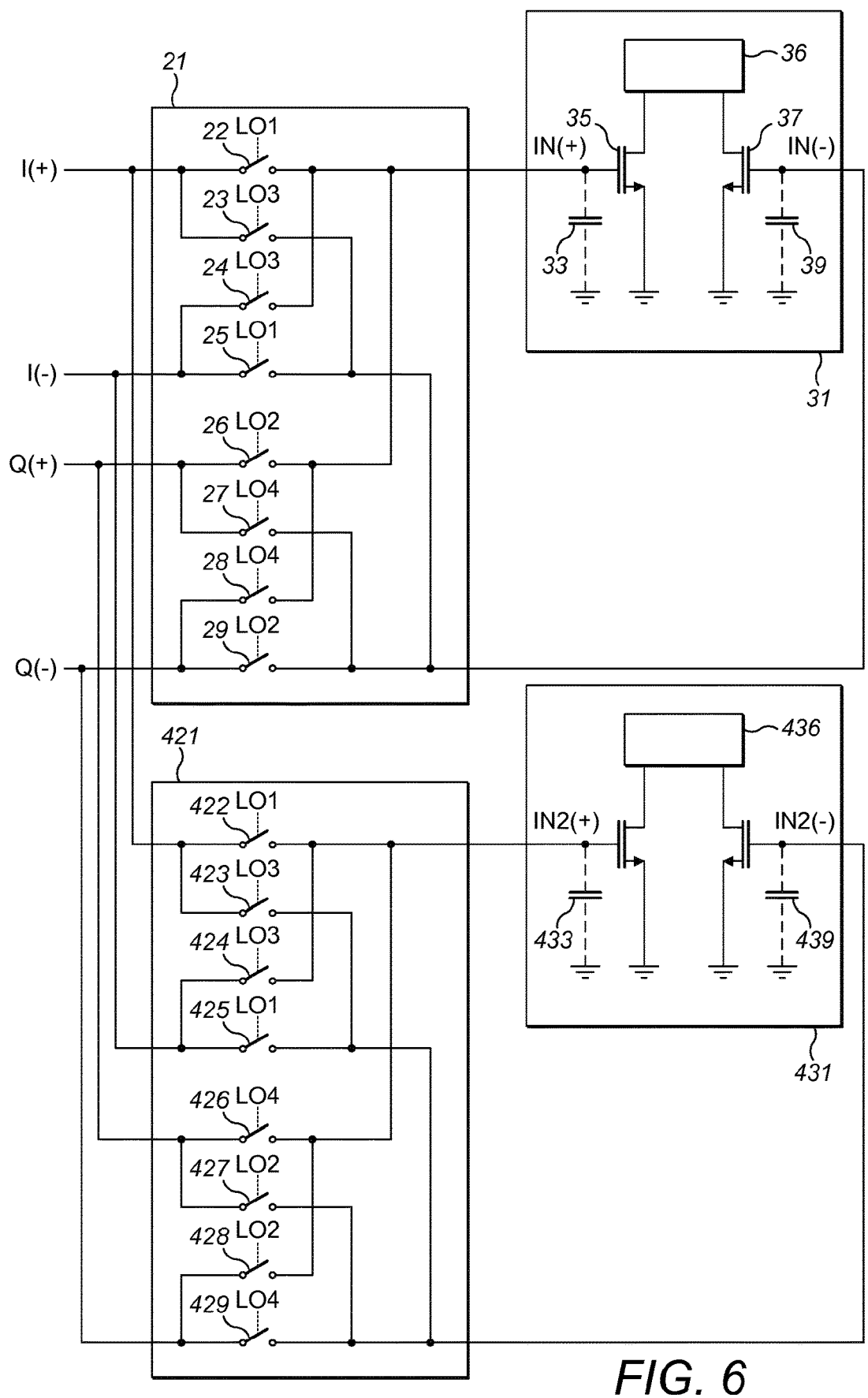
FIG. 6 illustrates part of another transmitter according to another embodiment of the invention.

In FIG. 6, a further embodiment comprising a charge canceller is shown. Again, the circuit is part of a transmitter. The circuit comprises the passive mixer 21, and the sub-circuit 31 configured in a similar arrangement to the circuits shown in FIG. 1 and FIG. 4. In the embodiment of FIG. 6, like FIGS. 1 and 4, the sub-circuit 31 is an amplifier. The baseband filter 11 is also present in this embodiment, although this is not shown in FIG. 6, for simplicity. Furthermore, the circuit comprises a charge canceller coupled to the input of the passive mixer 21. In this example, the charge canceller comprises a second passive mixer 421 and second sub-circuit 431. The second sub-circuit 431 is a second amplifier. The input of the second sub-circuit 431 is coupled to output of the second passive mixer 421 in a similar configuration to the passive mixer 21 and sub-circuit 31. Thus, the second passive mixer 421 and second sub-circuit 431 are (collectively) arranged in parallel with the passive mixer 21 and sub-circuit 31. The second sub-circuit 431 is similar in structure to the second sub-circuit 231 in FIG. 4 and similar reference numerals 433, 436, 439 indicate elements similar or identical to those 233, 236, 239 that are indicated in FIG. 4. Like the embodiment of FIG. 4, the transistors of the second sub-circuit 431 are coupled to a block 436 that represents schematically the remainder of the second sub-circuit 431, e.g. the remainder of the amplifier used in the transmitter. Block 436 in FIG. 6 may be substantially identical to block 236 in the embodiment of FIG. 4.

The second passive mixer 421 is configured (or controlled) differently to the passive mixer 21 in that the second passive mixer 421 is configured to switch the differential quadrature-phase signals with an opposite polarity to the first passive mixer 21 switching of the quadrature-phase signals. In one embodiment this can be implemented by controlling the switching of the second passive mixer 421 to switch the quadrature-phase signals at the opposite phase to that of the first passive mixer 21—that is, using LO4 for LO2 switching, and vice versa. In an alternative embodiment (not illustrated), the opposite polarity switching can be implemented by simply reversing the connections between the terminals Q(+) and Q(−) and the second passive mixer. In other words, where the first passive mixer 21 has an input connected to Q(+), the second passive mixer would have its corresponding input connected to Q(−). To put it another way, in the embodiment pictured in FIG. 6, the polarity change is achieved by swapping the LO signals LO2 and LO4. In the alternative embodiment the polarity change is achieved by swapping the Q-channel baseband signals.

In greater detail, the second passive mixer 421 comprises a first pair of switches 422 and 425 controlled by a first phase LO signal LO1 configured to couple the positive and negative differential baseband in-phase signals I(+) and I(−) to positive and negative inputs, IN2(+) and IN2(−), of the second sub-circuit 431, respectively. Similarly, the second passive mixer 421 comprises a second pair of switches 423 and 424 controlled by a third phase LO signal LO3 configured to couple the positive and negative differential baseband in-phase signals I(+) and I(−) to the negative and positive inputs IN2(−) and IN2(+) of the second sub-circuit, respectively. In other words the operations of the passive mixer 21 and second passive mixer 421 are similar or identical to one another for the in-phase related switching. The first passive mixer 21 first pair of switches 22, 25 and the second passive mixer 421 first pair of switches 422, 425 are configured to be operated in synchrony. The first passive mixer 21 second pair of switches 23, 24 and the second passive mixer 421 second pair of switches 423, 424 are also configured to be operated in synchrony.

In the embodiment shown in FIG. 6, the passive mixer 21 third pair of switches 26, 29 are configured to couple positive and negative differential baseband quadrature-phase signals Q(+) and Q(−) to the positive and negative inputs IN(+) and IN(−) for the first sub-circuit 31, respectively. These two switches are controlled based on the second LO signal LO2. In contrast, although the second passive mixer 421 third pair of switches 426, 429 are configured to couple the positive and negative differential baseband quadrature-phase signals Q(+) and Q(−) to the positive and negative inputs IN2+ and IN2− for the second sub-circuit 431 respectively, these two switches are controlled based on the fourth LO signal LO4.

Furthermore, the passive mixer 21 fourth pair of switches 27, 28 are configured to couple the positive and negative differential baseband quadrature-phase signals Q(+) and Q(−) to the negative and positive inputs IN(−) and IN(+) for the sub-circuit 31 respectively. These switches are controlled based on the fourth LO signal LO4. In contrast, although the second passive mixer 421 fourth pair of switches 427, 428 are likewise configured to couple the positive and negative differential baseband quadrature-phase signals Q(+) and Q(−) to the negative and positive inputs IN2− and IN2+ of the second sub-circuit 431 respectively, these switches are controlled based on the second LO signal LO2. In other words, the operations of the passive mixer 21 and second passive mixer 421 complement each other for the quadrature-phase related switching, wherein the first passive mixer 21 third pair of switches 26, 29 and the second passive mixer 421 fourth pair of switches 427, 428 are configured to be operated in synchrony and the first passive mixer 21 fourth pair of switches 27, 28 and the second passive mixer 421 third pair of switches 426, 429 are configured to be operated in synchrony.

Figure 7A:
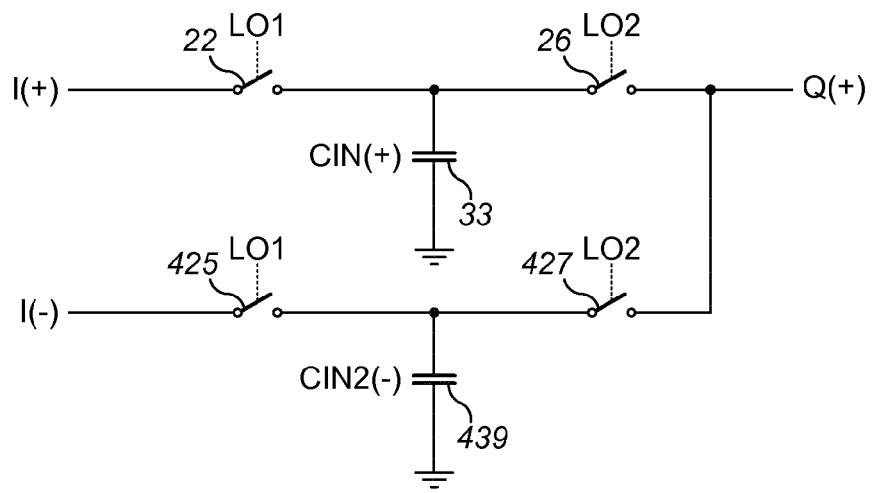
FIG. 7a illustrates a circuit model for the transmitter of FIG. 6.

This can furthermore be seen with respect to FIG. 7a which shows a model of the circuit shown in FIG. 6 between the first (I) phase controlled by the local oscillator signal LO1 and the second (Q) phase controlled by the LO signal LO2, wherein the effect of the second phase LO2 clock signal couples together the I(+) voltage, sampled onto the sub-circuit 31 input capacitance CIN(+), and the I(−) voltage stored on the second sub-circuit 431 input capacitance CIN2(−) to cancel each other out at the Q(+) node.

The table below shows the voltage at each of the inputs of the sub-circuit 31 and the inputs of the second sub-circuit 431 during the four phases of operation for the example circuit shown in FIG. 6. In this table, input IN(+) is the positive input and input IN(−) is the negative input of the first sub-circuit 31. Similarly, input IN2(+) is the positive input and input IN2(−) is the negative input of the second sub-circuit 431.

| | First sub-circuit 31 | | Second sub-circuit 431 | |
|---|---|---|---|---|
| Active LO Signal | IN(+) (CIN(+)) | IN(−) (CIN(−)) | IN2(+) (CIN2(+)) | IN2(−) (CIN2(−)) |
| LO1 | VI(+) | VI(−) | VI(+) | VI(−) |
| LO2 | VQ(+) | VQ(−) | VQ(−) | VQ(+) |
| LO3 | VI(−) | VI(+) | VI(−) | VI(+) |
| LO4 | VQ(−) | VQ(+) | VQ(+) | VQ(−) |

Furthermore, the following table shows how much charge is dumped into each mixer input at the start of each LO phase

|     | I(+)                          | I(−)                          | Q(+)                          | Q(−)                          |
| --- | ----------------------------- | ----------------------------- | ----------------------------- | ----------------------------- |
| LO1 | CIN(+)VQ(−) + CIN2(+)VQ(+)    | CIN(−)VQ(+) + CIN2(−)VQ(−)    |                               |                               |
| LO2 |                               |                               | CIN(+)VI(+) + CIN2(−)VI(−)    | CIN(−)VI(−) + CIN2(+)VI(+)    |
| LO3 | CIN(−)VQ(−) + CIN2(−)VQ(+)    | CIN(+)VQ(+) + CIN2(+)VQ(−)    |                               |                               |
| LO4 |                               |                               | CIN(−)VI(+) + CIN2(+)VI(−)    | CIN(+)VI(−) + CIN2(−)VI(+)    |

In all cases, the total or net charge dumped into the inputs of the passive mixers is zero. Since the charge has been cancelled then the IQ (or quadrature) crosstalk and thus asymmetry is removed.

Figure 7B:
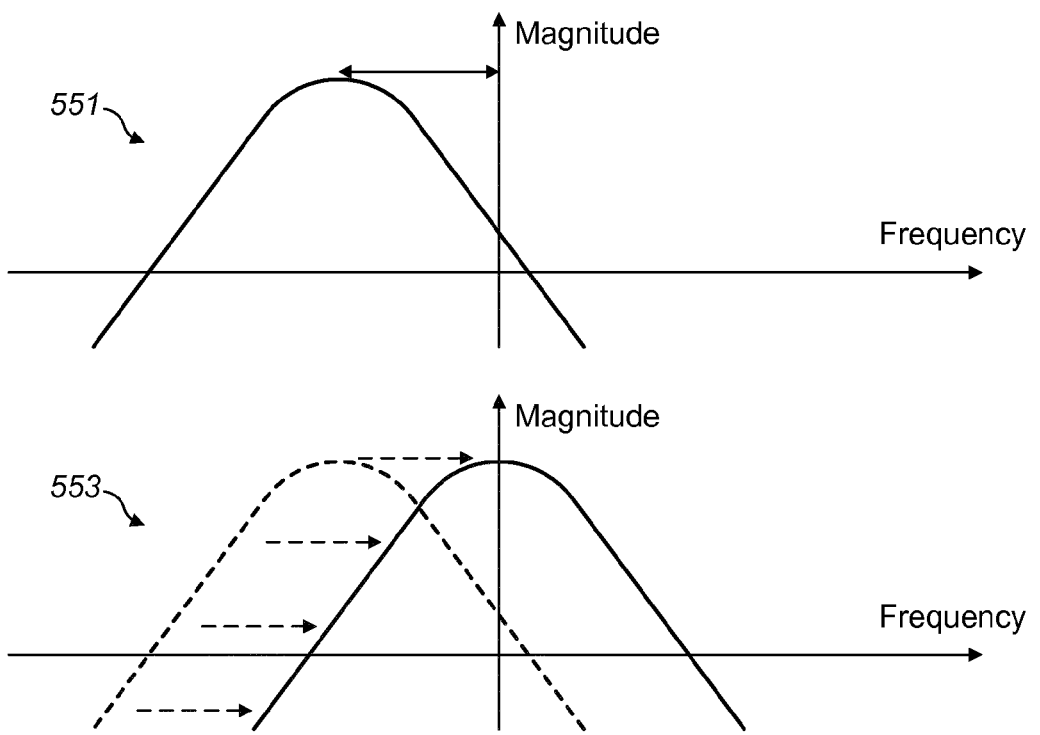
FIG. 7b illustrates the frequency responses of the baseband filter in the circuit of FIG. 1 and a baseband filter in a circuit according to an embodiment of the invention, respectively.

With respect to FIG. 7b, a series of transfer functions for a second order or 2-pole filter are shown. The upper graph 551 of FIG. 7b shows the positive & negative frequencies of the original transfer function, in other words a circuit without charge cancelling. Here it can be seen that the effect of the crosstalk between the I- and Q-channels causes an asymmetrical response about the frequency (horizontal) axis. The lower graph 553 of FIG. 7b shows the symmetrical response for positive and negative frequencies of the transfer function following the application of embodiments as described herein. In other words, the charge cancellers such as described herein restore the transfer function symmetry about DC.

In some embodiments—for example, using a dual mixer approach, as shown in FIG. 6—the switches in the second mixer 421 can be implemented as smaller switches than the switches in the mixer 21. In an embodiment in which the switches are implemented as transistors, this can mean that the transistors in the second mixer 421 can have a smaller size than those in the first mixer 21.

In the examples shown herein the charge canceller is implemented either by a second sub-circuit 231 coupled via a switching network 221, 223, 225, 227 to the output of the first passive mixer 21 or a second sub-circuit 431 coupled to a second mixer 421. The second sub-circuit (and its associated capacitance) can better match the sub-circuit 31 (and its associated capacitance) if the load in the second sub-circuit 231 or 431 attempts to emulate the real load of the sub-circuit 31 (which may be an antenna load). It is understood that, in some embodiments, the second sub-circuit can be coupled to no load.

Furthermore, in some embodiments, the charge canceller may be implemented as a capacitor with a capacitance value similar or substantially similar to the input capacitance of the sub-circuit 31. For example, the capacitor may be realised as at least one transistor configured to operate as a capacitor, for example by coupling at least one transistor gate to the switching network or the second passive mixer and coupling the other terminals of the transistor(s) to a different potential such as ground or a power supply potential. Such embodiments may reduce the number of components or silicon area used for the transmitter circuit.

It would be understood that the switches described herein could be implemented according to any suitable process technology. For example the switch can in some embodiments be implemented as a MOSFET. The control terminal of such a switch can be the gate of the MOSFET.

In the embodiments described above, each passive mixer 21, 421 was described as one single "mixer". However, as will be apparent to those skilled in the art, this passive "mixer" can be considered as, or indeed implemented as, two separate mixer components, comprising an I-channel mixer for switching the in-phase signals and a Q-channel mixer for switching the quadrature phase signals. This is a matter of nomenclature, circuit layout, or division of labour. The scope of the invention is not limited to examples in which each passive mixer is implemented monolithically with integral switches for switching both in-phase and quadrature phase signals.

Also, in the embodiments described above, the inputs of the passive mixer 21 were coupled to the outputs of the baseband filter 11. This is not essential. In other embodiments, the inputs to the passive mixer 21 may be provided from a variety of other sources, including but not limited to: a reconstruction filter at the output of a Digital to Analogue Converter (DAC). In such an example, substantially all of the baseband processing would be performed in the digital domain, in a digital baseband processor, upstream of the DAC. The baseband filtering may also be performed in the digital domain.

In embodiments that include the baseband filter 11, this filter may be of any suitable type. The example of a first order (single pole) passive filter is used above purely as an example, in order to simplify the explanation and the mathematical analysis of the exemplary embodiments. The problem of a shift in the frequency response of the filter is (mathematically) easy to derive for a first order filter, but similar problems may also be found in higher order filters, for example.

Furthermore, in the embodiments described above, the transmitter circuit (of which a part is shown in FIGS. 1, 3, and 5) is just one example of a circuit. It is not essential for embodiments to be part of a transmitter. Likewise, it is not essential that the mixer outputs are coupled to an amplifier, as shown in the examples. The mixer outputs may be coupled to another type of differential sub-circuit. Whether the mixer outputs are coupled to a differential amplifier or another type of differential sub-circuit, the coupling need not be direct. The mixer outputs may be coupled to the differential sub-circuit indirectly, through additional circuit elements.

The function and implementation of the sub-circuit is immaterial to the invention and may be any block that presents a capacitive high-impedance node to the mixer output. By high-impedance node it is meant a node that does not have any low-impedance paths to other nodes such as ground and thus accumulates charge. Examples of such sub-circuits include an amplifier, a further passive (or active) mixer or an impedance matching network.

In the foregoing description, the first, second, third, and fourth phases refer to the respective LO signals. The "phases" create "time periods" as an effect of the LO signal or phase. The phase (LO signal) being high or "active" creates the time period. In the claims, for the avoidance of potential ambiguity, the expression "time period" will be used exclusively.

In the embodiment of FIG. 4, the charge canceller included two pairs of switches for the second sub-circuit. These were controlled by two respective LO signals $LO_{ODD}$ and $LO_{EVEN}$. In an alternative embodiment, instead of two pairs of switches controlled by these signals $LO_{ODD}$ and $LO_{EVEN}$, there may be four pairs of switches for the second sub-circuit: first and second pairs of switches controlled, respectively, by the LO signal LO1 controlling the first passive mixer first pair of switches and the LO signal LO3 controlling the first passive mixer second pair of switches, both the first and second pairs of switches being configured to couple the positive and negative inputs of the first sub-circuit to the positive and negative inputs of the second sub-circuit respectively; and third and fourth pairs of switches controlled, respectively, by the LO signal LO2 controlling the first passive mixer third pair of switches and the LO signal LO4 controlling the first passive mixer fourth pair of switches, both the third and fourth pairs of switches being configured to couple the positive and negative inputs of the first sub-circuit to the negative and positive inputs of the second sub-circuit respectively. In other words, two pairs of switches controlled by $LO_{ODD}$ and $LO_{EVEN}$ can be replaced by four pairs of switches controlled by the signals LO1, LO2, LO3, and LO4.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The embodiments may be implemented by means of hardware comprising several distinct elements. In a device claim enumerating several means, several of these means may be embodied by one and the same item of hardware. The mere fact that certain measures are recited in mutually different dependent claims does not indicate that a combination of these measures cannot be used to advantage. Furthermore in the appended claims lists comprising "at least one of: A; B; and C" should be interpreted as (A and/or B) and/or C.

Furthermore in general, the various embodiments may be implemented in hardware or special purpose circuits, software, logic or any combination thereof. For example, some aspects may be implemented in hardware, while other aspects may be implemented in firmware or software which may be executed by a controller, microprocessor or other computing device, although these are not limiting examples. While various aspects described herein may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

The embodiments described herein may be implemented by computer software executable by a data processor of the apparatus, such as in the processor entity, or by hardware, or by a combination of software and hardware. Further in this regard it should be noted that any blocks of the logic flow as in the Figures may represent program steps, or interconnected logic circuits, blocks and functions, or a combination of program steps and logic circuits, blocks and functions. The software may be stored on such physical media as memory chips, or memory blocks implemented within the processor, magnetic media such as hard disk or floppy disk, and optical media such as for example DVD and the data variants thereof, CD.

The memory may be of any type suitable to the local technical environment and may be implemented using any suitable data storage technology, such as semiconductor-based memory devices, magnetic memory devices and systems, optical memory devices and systems, fixed memory and removable memory. The data processors may be of any type suitable to the local technical environment, and may include one or more of general purpose computers, special purpose computers, microprocessors, digital signal processors (DSPs), application specific integrated circuits (ASIC), gate level circuits and processors based on multi-core processor architecture, as non-limiting examples.

The invention claimed is:

1. A circuit comprising:
a first passive mixer having mixer inputs configured to receive in-phase (I) and quadrature-phase (Q) differential signals; and
a first differential sub-circuit, wherein:
the first passive mixer is configured to switch the I and Q differential signals to the first differential sub-circuit at a mixing frequency;
the first differential sub-circuit further includes:
a pair of differential inputs configured to receive the switched I and Q differential signals from the first passive mixer, each input having a capacitor capable of storing a charge that depends on the switched in-phase or quadrature-phase signals; and
the circuit further comprises a charge canceller configured to supply, to the mixer inputs, to the pair of differential inputs, or to the mixer inputs and the pair of differential inputs, an opposite charge compared with a charge that has been stored on the pair of differential inputs by the operation of the first passive mixer.

2. The circuit as claimed in claim 1, wherein the charge canceller comprises a second passive mixer and a second differential sub-circuit in parallel with the first passive mixer and first differential sub-circuit.

3. The circuit as claimed in claim 2, wherein:
the first passive mixer is configured to switch the differential signals to the first differential sub-circuit in a plurality of non-overlapping time periods,
the second differential sub-circuit has a pair of differential inputs, and
the second passive mixer is configured to switch, to the mixer inputs, in the plurality of non-overlapping time periods, an opposite charge to a charge stored on the differential inputs of the first differential sub-circuit in the preceding time period, said opposite charge having been stored on the differential inputs of the second sub-circuit in said preceding time period.

4. The circuit as claimed in claim 3, wherein the pair of differential inputs of the first sub-circuit comprises a positive input and a negative input and the first passive mixer comprises:
a first pair of switches configured to couple positive and negative differential in-phase signals to the positive and negative inputs of the first sub-circuit respectively;
a second pair of switches configured to couple the positive and negative differential in-phase signals to the negative and positive inputs of the first sub-circuit respectively;
a third pair of switches configured to couple positive and negative differential quadrature-phase signals to the positive and negative inputs of the first sub-circuit respectively; and
a fourth pair of switches configured to couple the positive and negative differential quadrature-phase signals to the negative and positive inputs of the first sub-circuit respectively,
and wherein the pair of differential inputs of the second sub-circuit comprises a positive input and a negative input and wherein the second passive mixer comprises:

a first pair of switches configured to couple the positive and negative differential in-phase signals to the positive and negative inputs of the second sub-circuit respectively;

a second pair of switches configured to couple the positive and negative differential in-phase signals to the negative and positive inputs of the second sub-circuit respectively;

a third pair of switches configured to couple the positive and negative differential quadrature-phase signals to the positive and negative inputs of the second sub-circuit respectively; and a fourth pair of switches configured to couple the positive and negative differential quadrature-phase signals to the negative and positive inputs of the second sub-circuit respectively, wherein the first passive mixer first pair of switches and the second passive mixer first pair of switches are configured to be operated in synchrony, the first passive mixer second pair of switches and the second passive mixer second pair of switches are configured to be operated in synchrony, the first passive mixer third pair of switches and the second passive mixer fourth pair of switches are configured to be operated in synchrony, and the first passive mixer fourth pair of switches and the second passive mixer third pair of switches are configured to be operated in synchrony.

5. The circuit as claimed in claim 2, wherein;
the second differential sub-circuit comprises a pair of differential inputs each having a first capacitor;
one of the differential inputs of the first differential sub-circuit comprises a second capacitor; and
capacitances of the first capacitors are substantially equal to a capacitance of the second capacitor.

6. The circuit as claimed in claim 5, wherein the second differential sub-circuit is substantially identical to the first differential sub-circuit.

7. The circuit as claimed in claim 2, wherein the pair of differential inputs of the first sub-circuit comprises a positive input and a negative input and the first passive mixer comprises:
a first pair of switches configured to couple positive and negative differential in-phase signals to the positive and negative inputs of the first sub-circuit respectively;

a second pair of switches configured to couple the positive and negative differential in-phase signals to the negative and positive inputs of the first sub-circuit respectively;

a third pair of switches configured to couple positive and negative differential quadrature-phase signals to the positive and negative inputs of the first sub-circuit respectively; and a fourth pair of switches configured to couple the positive and negative differential quadrature-phase signals to the negative and positive inputs of the first sub-circuit respectively, and wherein the pair of differential inputs of the second sub-circuit comprises a positive input and a negative input and wherein the second passive mixer comprises:

a first pair of switches configured to couple the positive and negative differential in-phase signals to the positive and negative inputs of the second sub-circuit respectively;

a second pair of switches configured to couple the positive and negative differential in-phase signals to the negative and positive inputs of the second sub-circuit respectively;

a third pair of switches configured to couple the positive and negative differential quadrature-phase signals to the positive and negative inputs of the second sub-circuit respectively; and a fourth pair of switches configured to couple the positive and negative differential quadrature-phase signals to the negative and positive inputs of the second sub-circuit respectively, wherein the first passive mixer first pair of switches and the second passive mixer first pair of switches are configured to be operated in synchrony, the first passive mixer second pair of switches and the second passive mixer second pair of switches are configured to be operated in synchrony, the first passive mixer third pair of switches and the second passive mixer fourth pair of switches are configured to be operated in synchrony, and the first passive mixer fourth pair of switches and the second passive mixer third pair of switches are configured to be operated in synchrony.

8. The circuit as claimed in claim 1,
wherein the charge canceller comprises a second differential sub-circuit, the second differential sub-circuit being configured to be coupled to the output of the first passive mixer in a first configuration when the first passive mixer is configured to switch the in-phase differential signal to the first sub-circuit and the second differential sub-circuit being further configured to be coupled to the output of the passive mixer in a reversed polarity configuration when the first passive mixer is configured to switch the quadrature-phase signal to the first sub-circuit.

9. The circuit as claimed in claim 8, wherein:
the first passive mixer is configured to switch the differential signals to the first differential sub-circuit in a plurality of non-overlapping time periods,
the second differential sub-circuit has a pair of differential inputs, and
the circuit is configured to switch, to the differential inputs of the first differential sub-circuit, in the plurality of non-overlapping time periods, an opposite charge to a charge stored on those inputs in the preceding time period, said opposite charge having been stored on the differential inputs of the second sub-circuit in said preceding time period.

10. The circuit as claimed in claim 9, wherein the pair of differential inputs of the first sub-circuit comprises a positive input and a negative input, the second sub-circuit comprises a pair of differential inputs comprising a positive input and a negative input, and the first passive mixer comprises:
a first pair of switches configured to couple positive and negative differential in-phase signals to positive and negative inputs of the first sub-circuit respectively;

a second pair of switches configured to couple the positive and negative differential in-phase signals to the negative and positive inputs of the first sub-circuit respectively;

a third pair of switches configured to couple positive and negative differential quadrature-phase signals to the positive and negative inputs of the first sub-circuit respectively; and a fourth pair of switches configured to couple the positive and negative differential quadrature-phase signals to the negative and positive inputs of the first sub-circuit respectively, and wherein the circuit comprises:

a first pair of switches for the second sub-circuit configured to couple the positive and negative inputs of the first sub-circuit to the positive and negative inputs of the second sub-circuit respectively; and a second pair of switches for the second sub-circuit configured to couple the positive and negative inputs of the first sub-circuit to the negative and positive inputs for the second sub-circuit respectively, wherein the first pair of switches is configured to be on when the first passive mixer first pair of switches or second pair of switches is on and the second pair of switches is configured to be on when the first passive mixer third pair of switches or fourth pair of switches is on.

11. The circuit as claimed in claim 8, wherein the pair of differential inputs of the first sub-circuit comprises a positive input and a negative input, the second sub-circuit comprises a pair of differential inputs comprising a positive input and a negative input, and the first passive mixer comprises:

a first pair of switches configured to couple positive and negative differential in-phase signals to positive and negative inputs of the first sub-circuit respectively;

a second pair of switches configured to couple the positive and negative differential in-phase signals to the negative and positive inputs of the first sub-circuit respectively;

a third pair of switches configured to couple positive and negative differential quadrature-phase signals to the positive and negative inputs of the first sub-circuit respectively; and a fourth pair of switches configured to couple the positive and negative differential quadrature-phase signals to the negative and positive inputs of the first sub-circuit respectively, and wherein the circuit comprises:

a first pair of switches for the second sub-circuit configured to couple the positive and negative inputs of the first sub-circuit to the positive and negative inputs of the second sub-circuit respectively; and a second pair of switches for the second sub-circuit configured to couple the positive and negative inputs of the first sub-circuit to the negative and positive inputs for the second sub-circuit respectively, wherein the first pair of switches is configured to be on when the first passive mixer first pair of switches or second pair of switches is on and the second pair of switches is configured to be on when the first passive mixer third pair of switches or fourth pair of switches is on.

12. The circuit as claimed in claim 1, wherein the or each differential sub-circuit comprises at least one of:
a differential amplifier;
a mixer; or
a filter.

13. The circuit as claimed in claim 1, further comprising:
a filter configured to supply the I and Q differential signals to the first passive mixer.

* * * * *